(12) United States Patent
Hsia et al.

(10) Patent No.: US 11,146,227 B1
(45) Date of Patent: Oct. 12, 2021

(54) OPEN-LOOP TRACKING CONTROL MODULE TO CONTROL INPUT RANGE SWING FOR RADIATION-HARDENED DEVICES

(71) Applicants: Timothy T. Hsia, Irvine, CA (US); Victor K. Lee, Irvine, CA (US)

(72) Inventors: Timothy T. Hsia, Irvine, CA (US); Victor K. Lee, Irvine, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 216 days.

(21) Appl. No.: 16/562,948

(22) Filed: Sep. 6, 2019

(51) Int. Cl.
*H03G 11/04* (2006.01)

(52) U.S. Cl.
CPC ................... *H03G 11/04* (2013.01)

(58) Field of Classification Search
CPC ........................................................ H03G 11/04
See application file for complete search history.

(56) References Cited

U.S. PATENT DOCUMENTS

| | | | |
|---|---|---|---|
| 4,999,552 A | 3/1991 | Seipelt | |
| 5,305,192 A | 4/1994 | Bonte et al. | |
| 5,422,562 A | 6/1995 | Mammano et al. | |
| 5,508,603 A | 4/1996 | Strong, III | |
| 5,672,918 A | 9/1997 | Kimbrough et al. | |
| 6,320,465 B1 * | 11/2001 | Masini .................... | H03F 3/217 |
| | | | 330/207 A |
| 7,525,345 B2 * | 4/2009 | Jang .................... | H03K 19/0013 |
| | | | 326/83 |
| 9,753,473 B2 | 9/2017 | Tan et al. | |
| 9,793,707 B2 | 10/2017 | Torres et al. | |
| 9,966,837 B1 | 5/2018 | Seaton | |
| 2006/0104095 A1 | 5/2006 | Summer | |
| 2007/0024263 A1 | 2/2007 | Yang | |
| 2007/0159146 A1 | 7/2007 | Mandal | |
| 2009/0033298 A1 | 2/2009 | Kleveland | |
| 2009/0174385 A1 | 7/2009 | Yen et al. | |
| 2009/0289720 A1 | 11/2009 | Takinami et al. | |
| 2011/0148388 A1 | 6/2011 | Zanchi et al. | |
| 2012/0044774 A1 * | 2/2012 | Tran .................... | G11C 11/5642 |
| | | | 365/189.07 |

(Continued)

OTHER PUBLICATIONS

Non Final Office Action for U.S. Appl. No. 16/563,023 dated Jan. 7, 2021.

(Continued)

*Primary Examiner* — Scott Bauer
(74) *Attorney, Agent, or Firm* — Tarolli, Sundheim, Covell & Tummino LLP

(57) ABSTRACT

A circuit includes a tracking control module that receives an input voltage and a dynamic reference voltage. The tracking control module generates a swing-limited output voltage to mitigate over-voltage swings of the input voltage. The tracking control module includes a bias tracker that receives the dynamic reference voltage and generates a reference tracking control signal that tracks voltage changes in the dynamic reference voltage. A swing-limiter receives the reference tracking control signal and the input voltage. The swing-limiter limits the magnitude of the received input voltage based on a threshold and adjusts the swing-limited output voltage in response to the reference tracking control signal.

20 Claims, 11 Drawing Sheets

(56) References Cited

U.S. PATENT DOCUMENTS

| | | | |
|---|---|---|---|
| 2012/0197447 A1 | 8/2012 | Fossion et al. | |
| 2013/0033289 A1* | 2/2013 | Monga | H03K 19/018528 |
| | | | 326/81 |
| 2013/0234684 A1 | 9/2013 | Chang et al. | |
| 2017/0115678 A1 | 4/2017 | Qing et al. | |
| 2017/0115680 A1 | 4/2017 | Zhou et al. | |
| 2017/0187367 A1* | 6/2017 | Ratz | H03K 17/0828 |
| 2017/0220058 A1* | 8/2017 | Petenyi | G05F 1/575 |
| 2017/0229962 A1* | 8/2017 | Bansal | H02M 1/08 |
| 2018/0048232 A1 | 2/2018 | Adell et al. | |
| 2018/0120876 A1 | 5/2018 | Petenyi | |
| 2018/0281994 A1 | 10/2018 | De Payrebrune | |
| 2019/0052110 A1 | 2/2019 | Liu et al. | |
| 2020/0004281 A1 | 1/2020 | Chao | |
| 2020/0004284 A1 | 1/2020 | Harada | |
| 2020/0133324 A1 | 4/2020 | Nagata et al. | |
| 2021/0103306 A1 | 4/2021 | Hwang et al. | |

OTHER PUBLICATIONS

Final Office Action issued for related U.S. Appl. No. 16/563,023 dated Jun. 8, 2021.

* cited by examiner

OPEN-LOOP TRACKING CONTROL MODULE TO CONTROL INPUT RANGE SWING FOR RADIATION-HARDENED DEVICES

GOVERNMENT INTEREST

The invention was made under Government Contract. Therefore, the US Government has rights to the invention as specified in that contract.

TECHNICAL FIELD

This disclosure relates to amplifier circuits, and more particularly to an open-loop tracking control module to control input range swings for radiation-hardened devices.

BACKGROUND

Radiation hardening includes designing and producing electronic components and systems that are resistant to damage or malfunctions caused by ionizing radiation (e.g., particle radiation and high-energy electromagnetic radiation). Such radiation, for example, may be encountered in outer space and high-altitude flight. Most semiconductor electronic components are susceptible to radiation damage, however radiation-hardened component designs are based on their non-hardened equivalents, with some design and manufacturing variations that reduce the susceptibility to radiation damage. Due to the extensive development and testing required to produce a radiation-tolerant design of a microelectronic chip for example, radiation-hardened chips tend to lag behind the most recent technological developments. Radiation-hardened components are typically tested to one or more resultant effects tests, including total ionizing dose (TID), enhanced low dose rate effects (ELDRS), neutron and proton displacement damage, and single event effects (SEE).

In an example application, a radiation-hardened by design (RHBD) device utilizes thin-oxide transistors (e.g., 1.8V) at the differential input of a comparator and/or amplifier. This can present a problem for an integrated circuit (IC) chip that employs the respective comparator or amplifier yet runs on higher supply rail (e.g., 5V) than the RHBD device. Thus, these radiation-hardened thin-oxide devices can be damaged if their junction voltages exceed the factory specified maximum rating for the device. Also, limiting the input-range of the comparator or amplifier to a lower voltage supported by the RHBD device can significantly reduce the dynamic range of the entire IC that employs such devices and thus, lower the overall performance and the applicability of the associated radiation-hardened design. Thus, the IC won't be as useful to support as many varieties of applications that have wide range of input requirements if dynamic range is reduced.

SUMMARY

This disclosure relates to a tracking control module to control input range swings for radiation-hardened devices. In one aspect, a circuit includes a tracking control module that receives an input voltage and a dynamic reference voltage. The tracking control module generates a swing-limited output voltage to mitigate over-voltage swings of the input voltage. The tracking control module includes a bias tracker that receives the dynamic reference voltage and generates a reference tracking control signal that tracks voltage changes in the dynamic reference voltage. A swing-limiter receives the reference tracking control signal and the input voltage. The swing-limiter limits the magnitude of the received input voltage based on a threshold and adjusts the swing-limited output voltage in response to the reference tracking control signal.

In another aspect, a circuit includes an integrated circuit (IC) that includes a radiation hardened by design (RHBD) device having a device input. The RHBD device is operatively coupled to the IC and operates at a device voltage (VDEV) that is less than an operating voltage (VDD) of the IC. A bias tracker receives a dynamic reference voltage and generates a reference tracking control signal that tracks voltage changes in the dynamic reference voltage. The bias tracker includes a bias input stage and a bias output stage. The bias input stage receives an input bias current (IBIAS) and the operating voltage VDD of the IC. The input bias stage provides an output bias current based on IBIAS and VDD to bias the bias output stage of the bias tracker. A swing-limiter transistor device receives the reference tracking control signal from the bias tracker and an input voltage. The swing-limiter transistor device generates a swing-limited output voltage in response to the reference tracking control signal and the input voltage. The swing-limiter transistor device limits the magnitude of the received input voltage based on a threshold and adjusts the swing-limited output voltage in response to the reference tracking control signal. The swing-limiter transistor device provides the swing-limited output voltage to the RHBD device.

In yet another aspect, a system includes an integrated circuit (IC) that includes a radiation hardened by design (RHBD) device having a device input. The RHBD device is operatively coupled to the IC and operates at a device voltage (VDEV) that is less than an operating voltage (VDD) of the IC. A tracking control module receives an input voltage and a dynamic reference voltage. The tracking control module generates a swing-limited output voltage to the RHBD device based on the input voltage and the dynamic reference voltage. The tracking control module includes a bias tracker that receives the dynamic reference voltage and generates a reference tracking control signal that tracks voltage changes in the dynamic reference voltage. A swing-limiter receives the reference tracking control signal and the input voltage. The swing-limiter limits the magnitude of the received input voltage to the RHBD device based on the threshold and adjusts the swing-limited output voltage in response to the reference tracking control signal.

DETAILED DESCRIPTION

Figure 1:
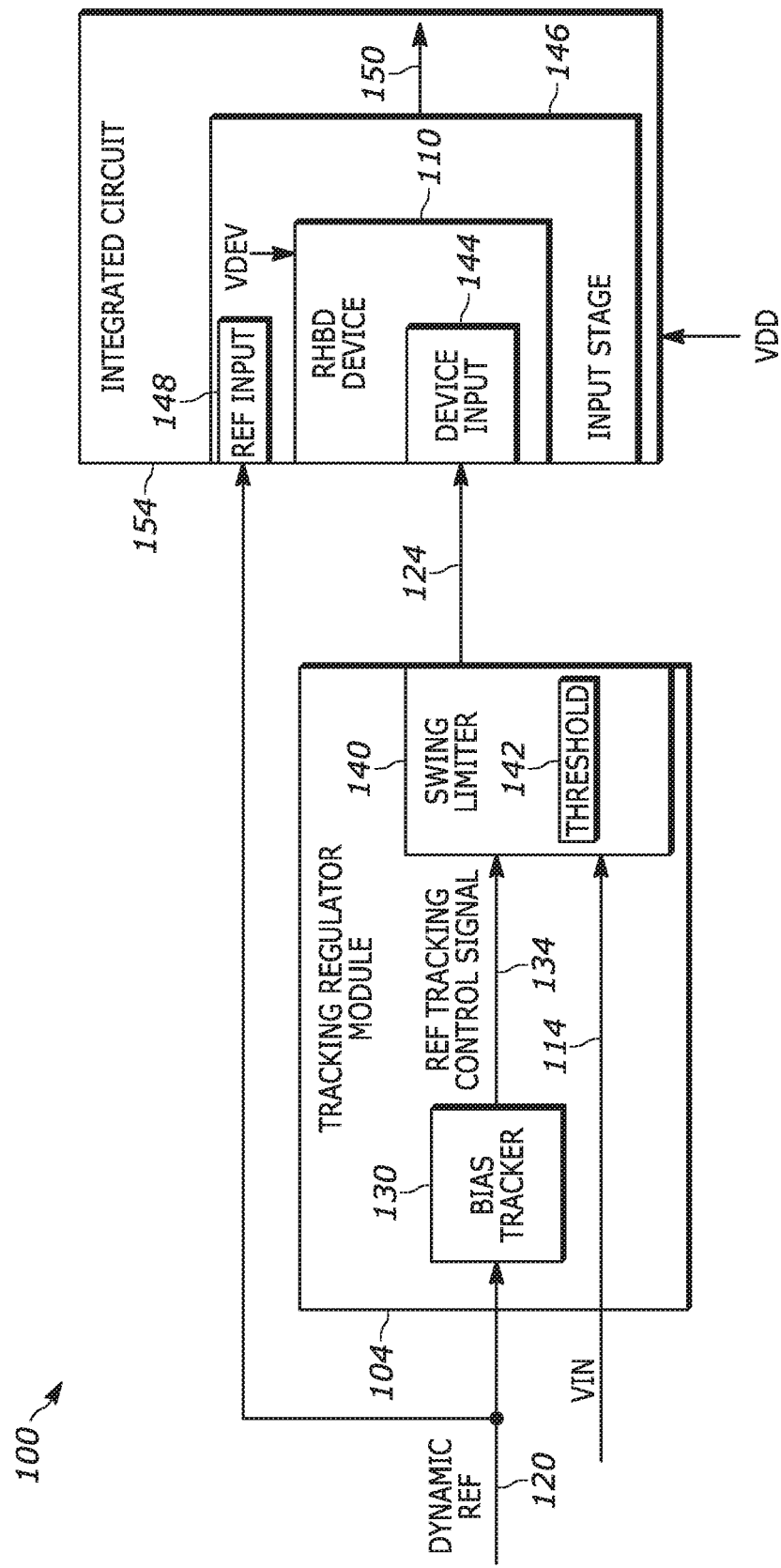
FIG. 1 illustrates a block diagram of an example circuit that employs a tracking control module to limit input range swings to a radiation hardened by design device.

This disclosure relates to a tracking control module to control input range swings for radiation-hardened by design (RHBD) devices that operate at lower voltages and are employed at an input stage of an integrated circuit (IC) chip operating at higher voltages. The tracking control module dynamically controls and suppresses the input swing range of an input voltage applied to the RHBD device and concurrently tracks to a dynamic reference voltage that is automatically correlated and tracked to the input voltage. The dynamic reference voltage can vary by DC voltage variations and/or AC voltage variations due to noise or radiation encountered in outer space. The dynamic reference voltage can be provided to one input of a comparator and/or amplifier circuit where the input voltage is swing-limited and applied to another input of the comparator/amplifier to protect the RHBD device. The swing-limited input voltage is dynamically tracked to the dynamic reference voltage such that a low-voltage RHBD thin-oxide input device operating as a differential pair in the input stage can work within its absolute junction rating. By dynamically tracking the reference voltage while the input voltage is swing-limited to protect the RHBD device, the tracking control module supports the full dynamic range of wider IC applications operating at higher circuit voltages than capable by the lower-voltage RHBD device (e.g., RHBD device employed at input stage of a comparator or amplifier utilized in a pulse-width modulated (PWM) controller application).

In one example, the tracking control module can be implemented as a complimentary metallic oxide (CMOS) transistor-level circuit that protects RHBD devices that utilize lower voltage radiation-hardened thin-oxide transistors (e.g., 1.8V) at the differential input of a comparator and/or amplifier. This enables an IC chip that operates on a higher voltage supply rail (e.g., 5V), where the respective RHBD thin-oxide devices at the input stage of the IC can be easily damaged if their junction voltages were to exceed the factory-specified maximum rating for the device. Also, if the IC operating voltage was limited to the applied input-range (e.g., 1.8V) or lower, this could significantly reduce the dynamic range of the overall IC application (e.g., PWM controller) and thus limit the performance of the respective application. The tracking control module disclosed herein both protects the RHBD device at the input stage from over-voltage swings of the applied input voltage yet also facilitates increased dynamic range of the higher-voltage IC application that receives output from the lower-voltage RHBD device.

The tracking control module can be implemented as a system where wide-swing transmission-gates, a tracking control module/bias circuit, and a bypass comparator are employed to provide both positive and/or negative input swing protection that can also be incorporated into a circuit module that protects the low-voltage thinner-oxide transistors from electrical overstress. This allows for wide input dynamic range of the input voltage by enabling the module to protect against both high (supply) and low (ground) rails, while also not drawing near zero (or very low current) during the swing-limiting/protective action of the circuit. In addition, the tracking control module improves the speed at which the protection mechanisms described herein can engage with small amounts of time-delay. Furthermore, the tracking control module can autonomously track the input voltage with respect to the dynamic reference voltage to provide an optimal range of protection thresholds. Moreover, the tracking control module employs other protection circuitry to offset or circumvent additional leakage currents caused by total ionizing (TID) radiation encountered in outer space that can lead to over-stress of the thin-oxide transistors.

The respective tracking described herein can be performed without any feedback loop, therefore, the 'open-loop' uniqueness of this approach and the advantage is that open-loop approach does not need to consider issues such as instability and can provide much faster tracking response to dynamically moving reference and input signals. Also, the tracking modules described herein can provide protection against full input range, e.g., 0V to VDD in both directions for both P-type and N-type input differential-pair comparators/amplifiers.

As used herein, the term "circuit" can include a collection of active and/or passive elements that perform a circuit function, such as an analog circuit and/or digital circuit. Additionally or alternatively, for example, the term "circuit" can include an integrated circuit (IC) where all or some of the circuit elements are fabricated on a common substrate (e.g., semiconductor substrate, such as a die or chip), such as disclosed herein. For example, the tracking control module, RHBD device, PWM controller, and/or other control circuitry may be implemented as a respective IC chip.

FIG. 1 illustrates an example circuit 100 that employs a tracking control module 104 to limit input range swings to a radiation hardened by design (RHBD) device 110. As used herein, the term radiation-hardened by design refers to a device that has been designed to withstand radiation or other effects from high-altitude or deployment in outer space. Such RHBD devices 110 often operate at lower device voltages due to radiation-hardening design techniques than the operating voltage of a respective integrated circuit (IC) which they may interface with. The circuit 100 includes the tracking control module 104 that receives an input voltage VIN 114 and a dynamic reference voltage 120. The dynamic reference voltage can vary by DC voltage variations and/or AC voltage variations due to noise and/or radiation encountered in outer space. The tracking control module 104 generates a swing-limited output voltage 124 (e.g., positive or negative limiting) to mitigate over-voltage swings of the input voltage VIN 114.

The tracking control module 104 includes a bias tracker 130 that receives the dynamic reference voltage 120 and generates a reference tracking control signal 134 that tracks voltage changes in the dynamic reference voltage 120. In some cases, the bias tracker 130 is radiation-hardened to mitigate damages from space due to radiation. If the dynamic reference voltage 120 shifts due to AC noise, DC offsets, and/or other voltage changes, the bias tracker 130 in the tracking control module 104 senses the shift in voltage and adjusts the reference tracking control signal positively or negatively depending on the direction of shift in the dynamic reference voltage. A swing-limiter 140 receives the reference tracking control signal 134 and the input voltage VIN 114. The swing-limiter 140 limits the magnitude of the received input voltage VIN 120 based on a threshold 142 (e.g., VGS voltage of a transistor device) and adjusts the swing-limited output voltage 124 in response to the reference tracking control signal 134.

The swing-limiter 140 limits the magnitude of the input voltage VIN 120 to protect against electrical overstress of the RHBD device 110, where the respective limiting of the swing-limiter is also centered about the dynamic reference voltage 120 in response to the reference tacking control signal 134 which improves the dynamic range of downstream integrated circuits from the RHBD device operating at higher voltages. The RHBD device 110 includes a device input 144 to receive the swing-limited output voltage 124 from the tracking control module 104. The RHBD device 110 is part of an input stage 146 that includes a reference input 148 that receives the dynamic reference voltage 120. In an example, the input stage 146 could be a comparator or an amplifier stage that generates an output 150 based on the voltage relationship between the device input 144 and the reference input 148 at the input stage (e.g., if device input 144 has a higher voltage than the reference input, the output 150 swings positive).

The RHBD device 110 is operatively coupled to an integrated circuit (IC) 154. The RHBD device 110 operates at a device voltage (VDEV) (e.g., 1.8V) that is less than an operating voltage (VDD) (e.g., 5V) of the IC 154. The IC 154 includes a comparator circuit or an amplifier circuit in the input stage 146 that receives the dynamic reference voltage 120 at the reference input 148 and the swing-limited output voltage 124 at the device input 144. The comparator circuit or the amplifier circuit of the input stage 146 generates the output signal 150 based on the swing-limited output voltage's 124 relationship to the dynamic reference voltage 120. The output signal 150 can be employed by the IC 154 to regulate a control loop (or loops) that includes, for example, a pulse width modulated (PWM) control loop. An example system showing a comparator for the input stage 146 and a PWM controller as the IC 154 is illustrated and described below with respect to FIG. 2. It is noted that the circuit 100 operates in an open-loop manner where no feedback is sent back from the IC 154 to the tracking control module 104 to regulate either the swing-limited output signal 124 or the reference tracking control signal 134.

Figure 2:
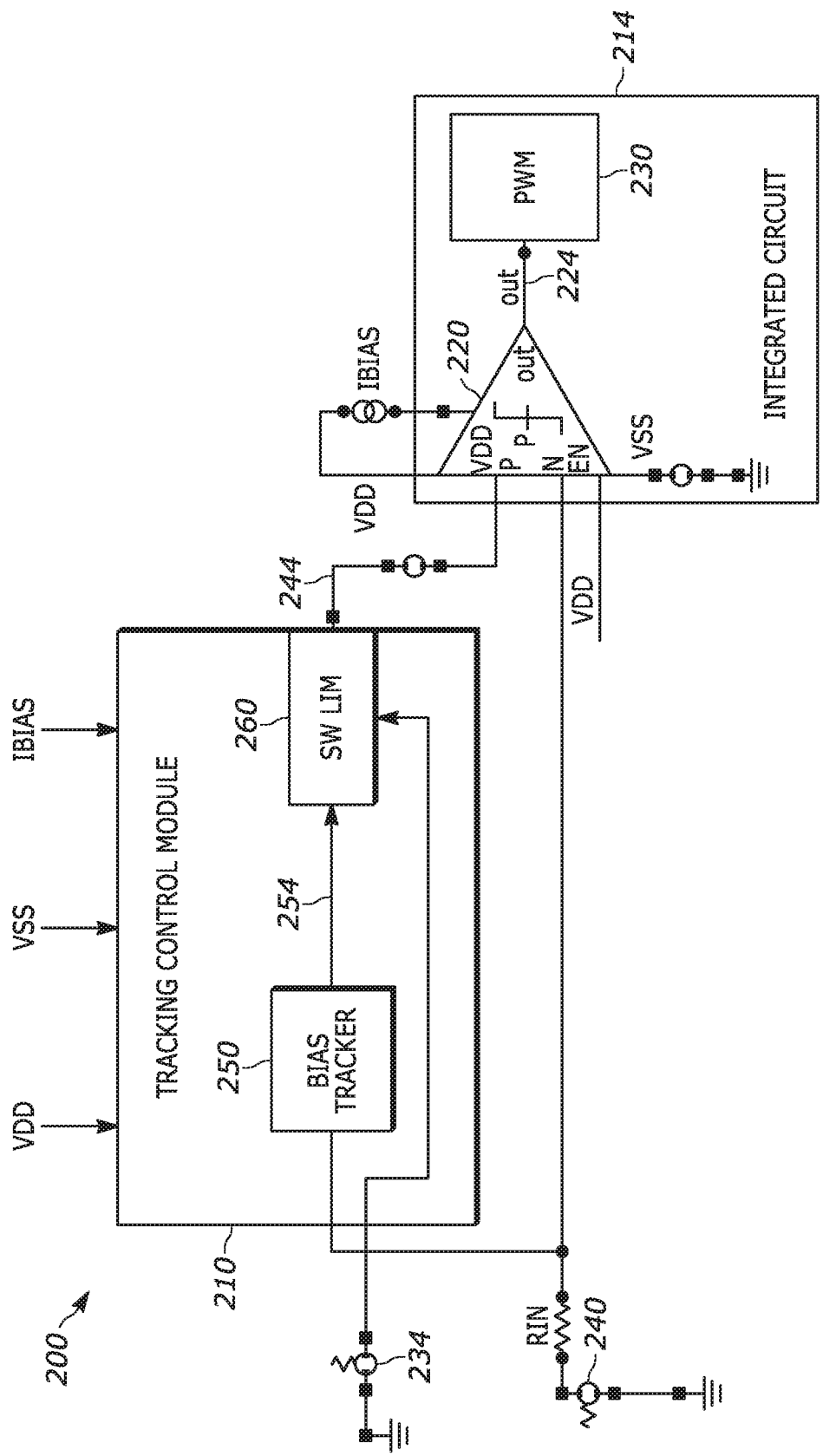
FIG. 2 illustrates an example system that employs a tracking control module to limit positive input range swings to an integrated circuit (IC) that employs a radiation hardened by design device at the input to the IC.

FIG. 2 illustrates an example system 200 that employs a tracking control module 210 to limit positive input range swings to an integrated circuit (IC) 214 that employs a radiation hardened by design device at the input to the IC. In this example, the RHBD device is not shown but is integrated at a P-input of a comparator 220 which operates as the input stage of the IC 214 (similar to input stage 146 of FIG. 1). In this example, output 224 of the comparator 220 feeds a pulse width modulated (PWM) circuit 230 (e.g., to regulate an output voltage based on comparator output) however other applications are possible as mentioned above with respect to FIG. 1. As mentioned previously, the RHBD device in the comparator 220 is operatively coupled to the IC and operates at a device voltage (VDEV) that is less than an operating voltage (VDD) of the IC. As shown, the comparator 220 receives operating voltages VDD, VSS, and operating current from current source *IBIS*.

The tracking control module 210 receives an input voltage 234 and a dynamic reference voltage 240 which is also fed through resistor RIN to the N-input of the comparator 220 operating as the reference input to the comparator. The tracking control module 210 generates a swing-limited output voltage 244 to the RHBD device in the comparator 220 based on the input voltage 234 and the dynamic reference voltage 240. The tracking control module includes a bias tracker 250 that receives the dynamic reference voltage 240 and generates a reference tracking control signal 254 that tracks voltage changes in the dynamic reference voltage. A swing-limiter 260 receives the reference tracking control signal 254 and the input voltage 234. The swing-limiter 260 limits the magnitude of the received input voltage 234 to the RHBD device based on a threshold (see e.g., threshold 142 of FIG. 1) and adjusts the swing-limited output voltage 244 in response to the reference tracking control signal 254. As shown, the tracking control module 210 receives input sources VDD, VSS, and IBIAs to operate the module. An example circuit implementation of the circuit and systems illustrated in FIGS. 1 and 2 is illustrated and described below with respect to FIG. 3.

Figure 3:
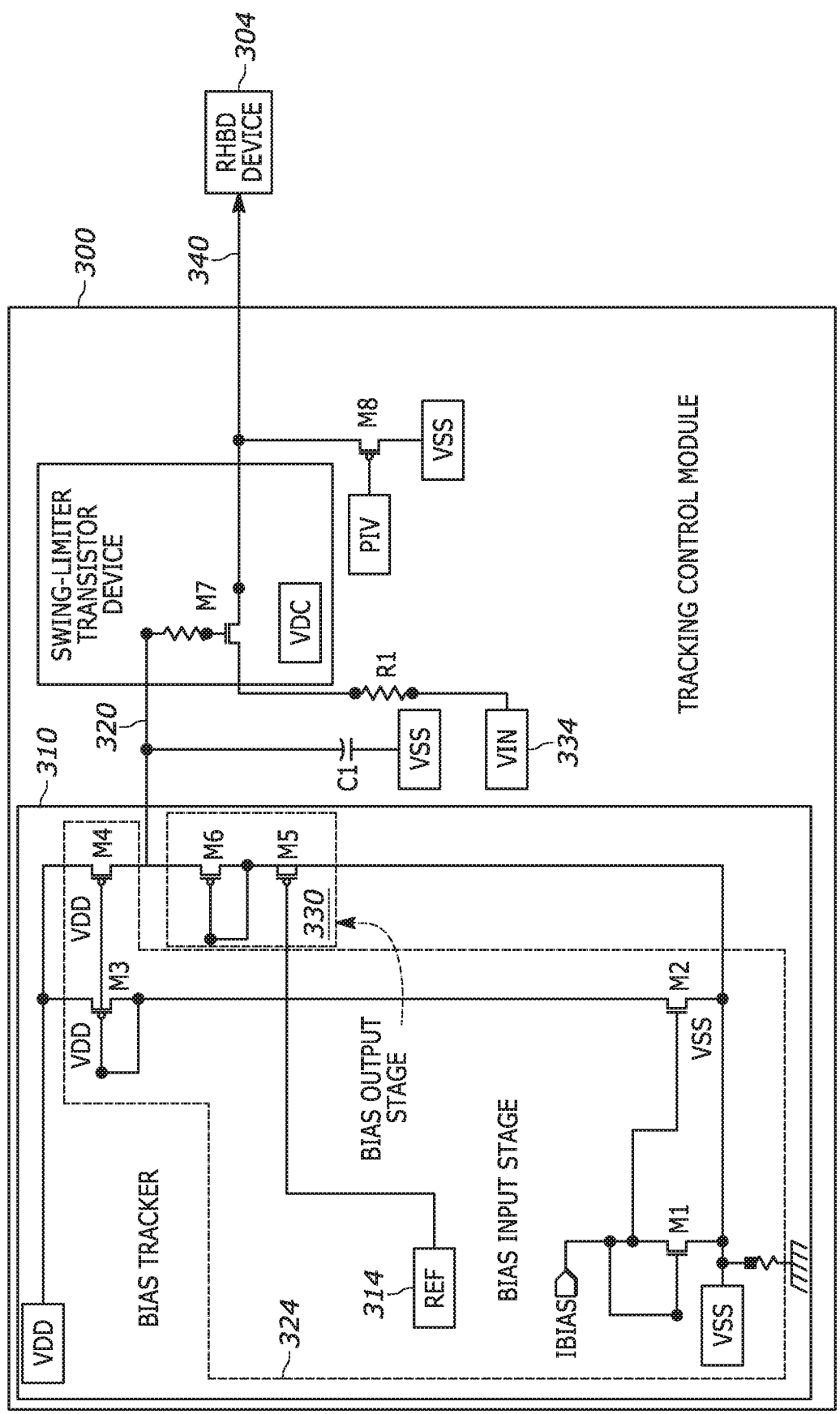
FIG. 3 illustrates an example circuit of a tracking control module to limit positive input range swings to a radiation hardened by design device.

FIG. 3 illustrates an example circuit of a tracking control module 300 to limit positive input range swings to a radiation hardened by design device (RHBD) 304. A bias tracker 310 receives a dynamic reference voltage 314 and generates a reference tracking control signal 320 that tracks voltage changes in the dynamic reference voltage. The bias tracker 310 includes a bias input stage 324 and a bias output stage 330. The bias input stage 324 receives an input bias current (IBIAS) and the operating voltages VDD and VSS of the IC. The input bias stage 324 provides an output bias current based on IBIAS and VDD to bias the bias output stage 330 of the bias tracker 310. A swing-limiter transistor device M7 receives the reference tracking control signal 320 from the bias tracker 310 and an input voltage VIN 334.

The swing-limiter transistor device M7 generates a swing-limited output voltage 340 in response to the reference tracking control signal 320 and the input voltage VIN 334. The swing-limiter transistor device M7 limits the magnitude of the received input voltage VIN 334 based on a threshold and adjusts the swing-limited output voltage 334 in response to the reference tracking control signal 320. The swing-limiter transistor device M7 provides the swing-limited output voltage 340 to the RHBD device 304. The threshold as described herein can be provided as a VGS drop across M5 and a VGS drop across M6 in the bias output stage 330. Thus, clamping/limiting of VIN 334 (where M7 turns off) will begin at approximately 2*VGS above the dynamic reference voltage 314 which is about 1.2V above the reference in this example.

A capacitor C1 provides filtering of the reference tracking control signal 320 from the bias tracker 310 and a resistor R1 supplies the input voltage VIN 334 to the swing-limiter transistor device M7. The transistor device M7 sources the swing-limited output voltage 340 from its source terminal, receives the reference tracking control signal 320 at its gate terminal, and includes an additional bias terminal at its source which is powered by VDC.

The bias input stage 324 includes a first transistor device M1, a second transistor device M2, a third transistor device M3, and a fourth transistor device M4. The first transistor device M1 receives IBIAS that is mirrored to drive the second transistor device M2. The second transistor device M2 provides current to drive the third transistor device M3 in response to the first transistor device M1. The third transistor device M3 mirrors the current received from the second transistor device M2 to supply the output bias current to the bias output stage 330. The bias output stage 330 includes a fifth transistor device M5 and a sixth transistor device M6. The fifth transistor device M5 receives the dynamic reference voltage 314 and provides an output to M6 based on the dynamic reference voltage. The sixth transistor device M6 receives the output from the fifth transistor device M5 and the output bias current from the bias input stage 324 to generate the reference tracking control signal 320 from the bias tracker 310. An eighth transistor device M8 is controlled by a predetermined input voltage PIV. The eighth transistor device M8 is coupled to the output node 340 of the seventh transistor device M7 to leak excess charge from the output node accumulated from radiation in outer space (or high-altitude flight).

Figure 4:
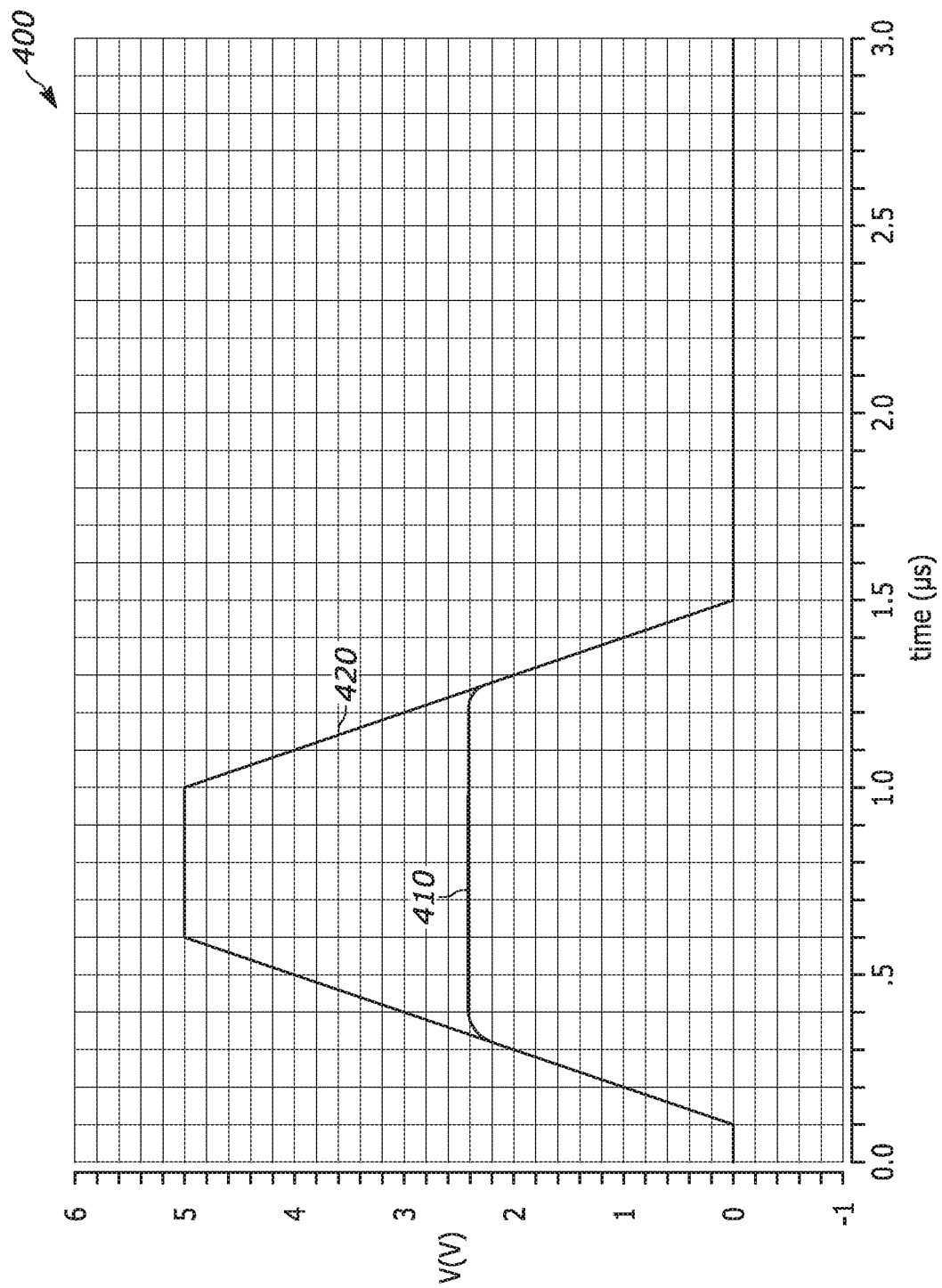
FIG. 4 illustrates an example waveform diagram for the tracking control module depicted in FIG. 3 showing a swing-limited output voltage in response to an input voltage.

FIG. 4 illustrates an example waveform diagram 400 for the tracking control module depicted in FIG. 3 showing a swing-limited output voltage 410 in response to an input voltage 420. Voltage in volts is represented on the vertical axis of the diagram 400 and time in microseconds is represented on the horizontal axis of the diagram. In this example, the input voltage 410 swings from about 0V to about 5V and back to about 0V in a period of about 1.5 microseconds. For this example, the dynamic reference voltage as described herein was set at about 1.2V. Thus, given the threshold example described above with respect to FIG. 3, output limiting/clamping begins at about 1.2V above the reference voltage which is about 2.4 Volts in this example where the swing-limited output voltage 410 is clamped.

Figure 5:
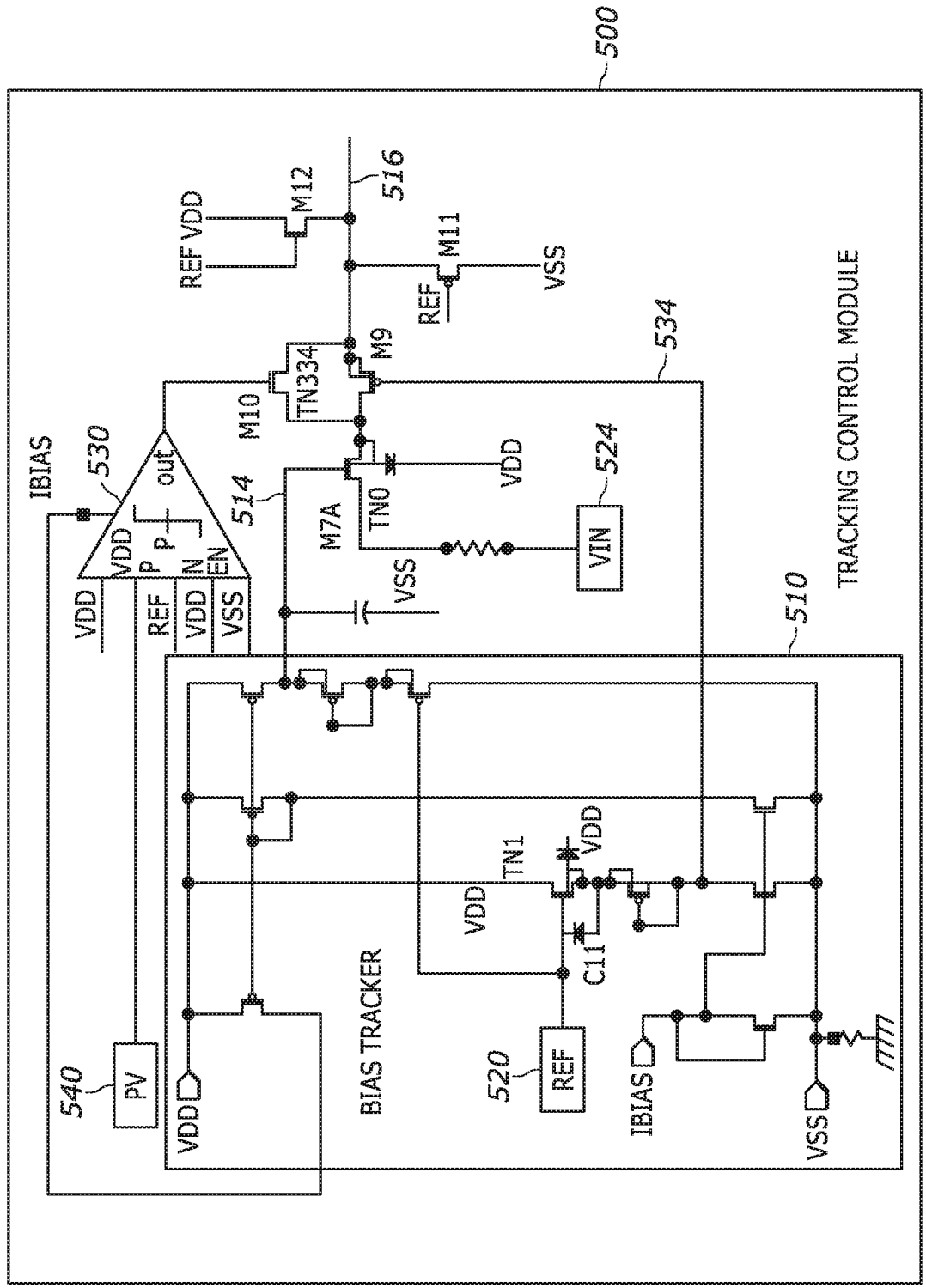
FIG. 5 illustrates an example circuit of a tracking control module to limit positive and negative input range swings to a radiation hardened by design device.

FIG. 5 illustrates an example circuit of a tracking control module 500 to limit positive and negative input range swings to a radiation hardened by design device (not shown). A bias tracker 510 generates a reference tracking control signal 514 based on a dynamic reference signal 520 and similarly to the previously described signal 320 of FIG. 3. For purposes of brevity, bias tracker 510 functionality will not be described due to similarity with the bias tracker 310 of FIG. 3. As shown, swing-limiting transistor device M7A is provided to limit an input voltage VIN 524 and operates similarly to transistor M7 of FIG. 3 to generate a swing-limited output voltage 516 and in response to reference tracking control signal 514. The tracking control module 500 includes a ninth transistor device M9, a tenth transistor device M10 to bypass the ninth transistor device M9, and a comparator 530 to control the tenth transistor device M10. The ninth transistor device M9 is coupled in series with the swing-limiter transistor device M7A and is controlled by a current output 534 from the bias input stage of the bias tracker 510.

The comparator 530 itself can be a RHBD device also so it can properly function in radiation environment. The comparator 530 compares a predetermined voltage (PV) 540 (e.g., 1.2V) to the dynamic reference voltage 520. If the dynamic reference voltage 520 is below the predetermined voltage 540, the comparator 530 enables the tenth transistor device M10 to bypass the ninth transistor device M9 such that the swing-limiter transistor device M7A limits the swing-limited output voltage 516 based on positive swings of the input voltage 524. If the dynamic reference voltage 520 is above the predetermined voltage 540, the comparator 530 disables the tenth transistor device M10 which enables the ninth transistor device M9 to limit the swing-limited output voltage 516 based on negative swings of the input voltage 524. An eleventh transistor device M11 and a twelfth transistor device M12 are controlled by a predetermined input voltage. The eleventh transistor device M11 and the twelfth transistor device M12 are coupled to output node 516 of the ninth transistor device M9 to leak excess charge from the output node accumulated from radiation in outer space.

Figure 6:
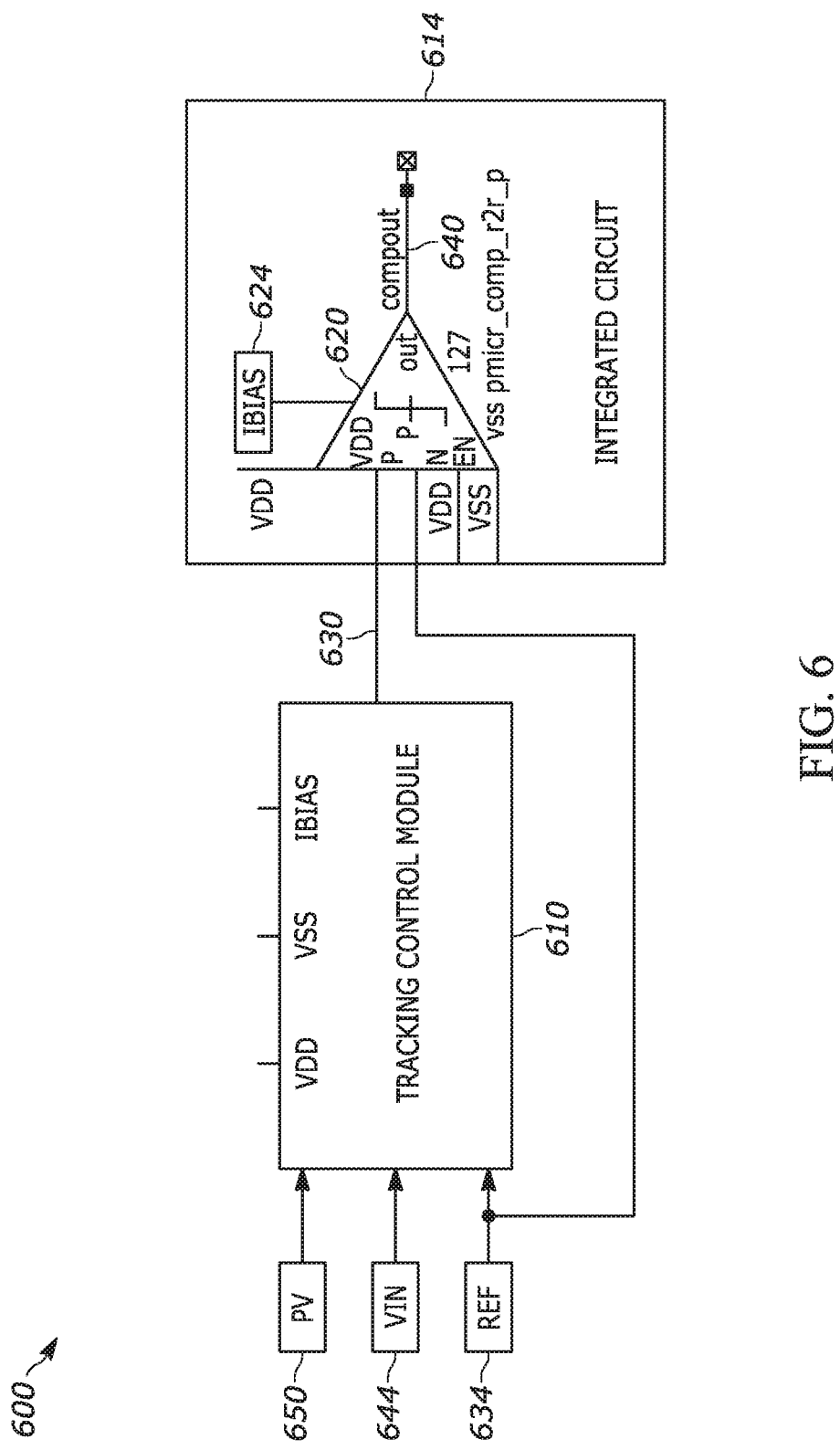
FIG. 6 illustrates an example system that employs a tracking control module to limit positive and negative input range swings to an integrated circuit (IC) that employs a radiation hardened by design device at the input to the IC.

FIG. 6 illustrates an example system 600 that employs a tracking control module 610 to limit positive and negative input range swings to an integrated circuit (IC) 614 that employs a radiation hardened by design device (not shown) at the input to the IC. In this example, a comparator 620 receives bias current from IBIAS source 624 and receives operating voltages VDD and VSS which also operate the tracking control module 610. The tracking control module 610 generates a swing-limited output voltage 630 to a radiation-hardened P-input to the comparator 620 which operates according to a device voltage (e.g., 1.8V) which is lower than the supply voltage VDD to the IC 614 and which supplies the comparator. The tracking control module 610 receives a dynamic reference voltage 634 to adjust the swing-limited output voltage 630 based on changes in the reference voltage.

The dynamic reference voltage 634 is also applied to a reference N-input of the comparator 620 which is used to determine an output signal 640 based on a comparison of the swing-limited output voltage 630 at the P-input to the reference at the N-input of the comparator. An input voltage VIN 644 is swing-limited (both positive and negative clamping) by the tracking control module 610 to generate the swing-limited output voltage 630 as previously described with respect to the tracking control module 500 of FIG. 5. To provide both positive and negative limiting of VIN 640, a predetermined voltage 650 is supplied to the tracking control module 610 which is supplied to an internal comparator to facilitate limiting of both positive and negative swings of VIN (see e.g., comparator 530 of FIG. 5).

FIGS. 7 through 11 illustrate example waveform diagrams 700, 800, 900, 1000, and 1100 respectively for the tracking control modules depicted in FIGS. 5 and 6 showing various swing-limited output voltage ranges in response to different input voltages. Voltage in volts is represented on the vertical axis of the respective diagrams and time in microseconds is represented on the horizontal axis of the respective diagrams.

Figure 7:
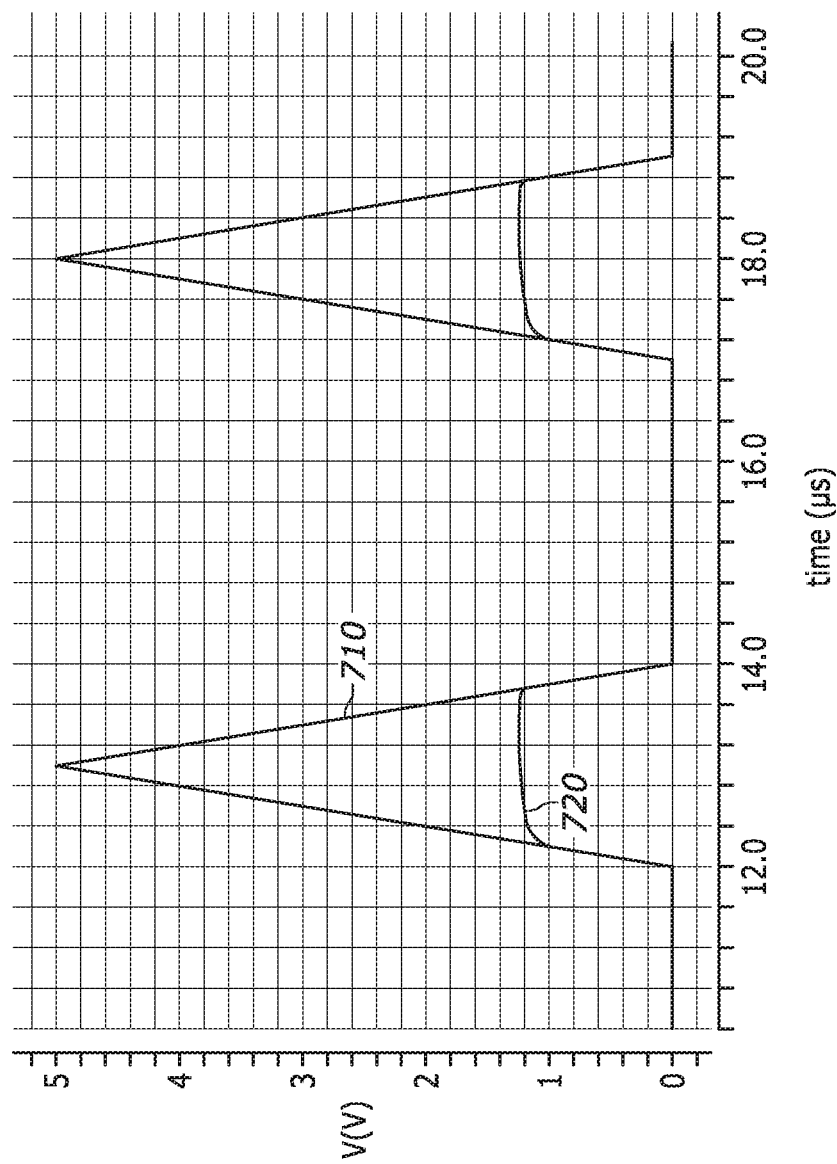
FIGS. 7 through 11 illustrate example waveform diagrams for the tracking control modules depicted in FIGS. 5 and 6 showing various swing-limited output voltage ranges in response to different input voltages.

With respect to FIG. 7, the dynamic reference voltage is set at about 0.2V. An input voltage 710 swings from about 0V to about 5V and back to about 0V in a period of about 2.0 microseconds. As shown, a swing-limited output is generated at 720 which is limited to about 1.2V.

Figure 8:
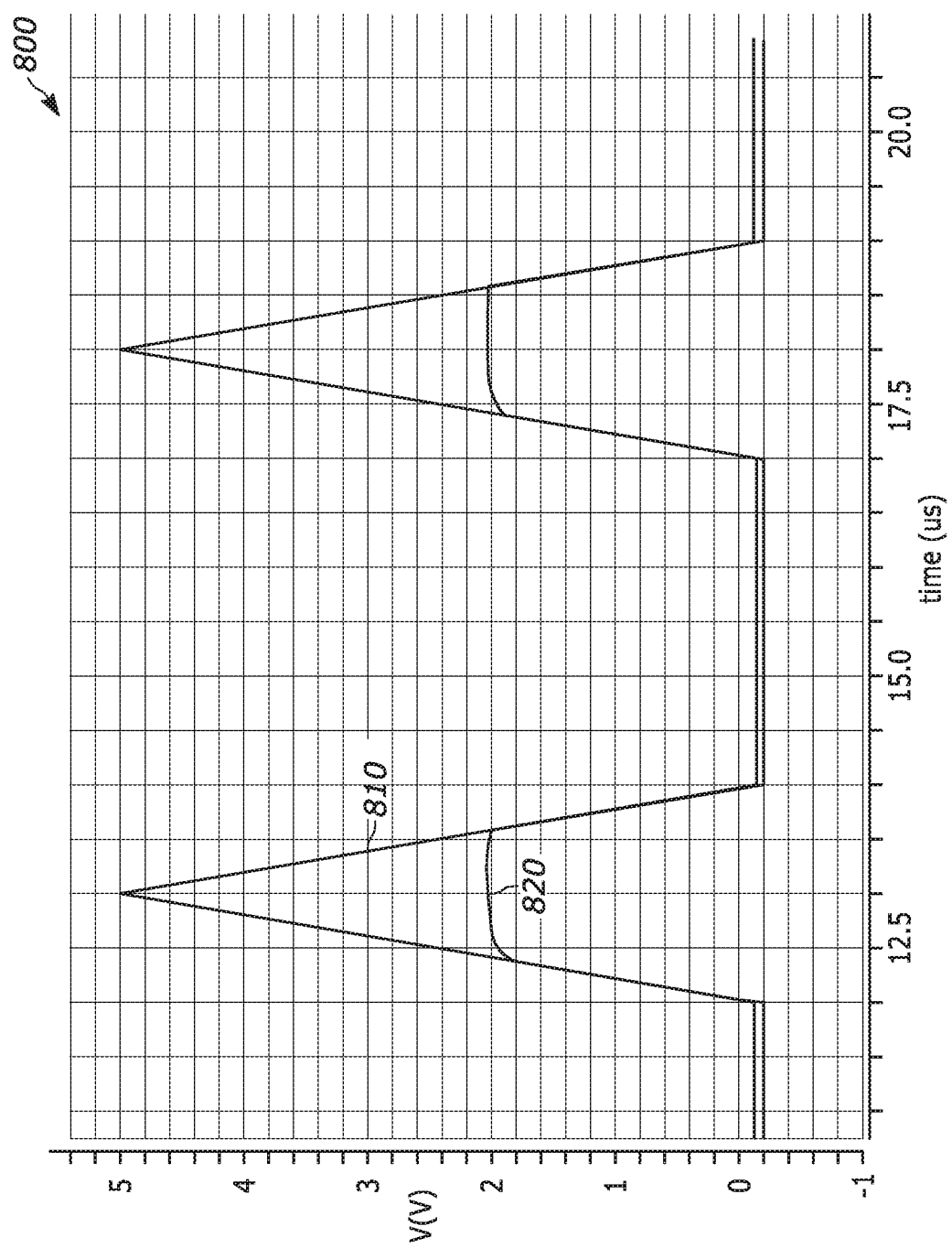

With respect to FIG. 8, the dynamic reference voltage is set at about 1.0V. An input voltage 810 swings from about −0.18V to about 5V and back to about −0.18V in a period of about 2.8 microseconds. As shown, a swing-limited output is generated at 820 which is limited to about −0.2V on the low end to about 2.0V on the high end.

Figure 9:
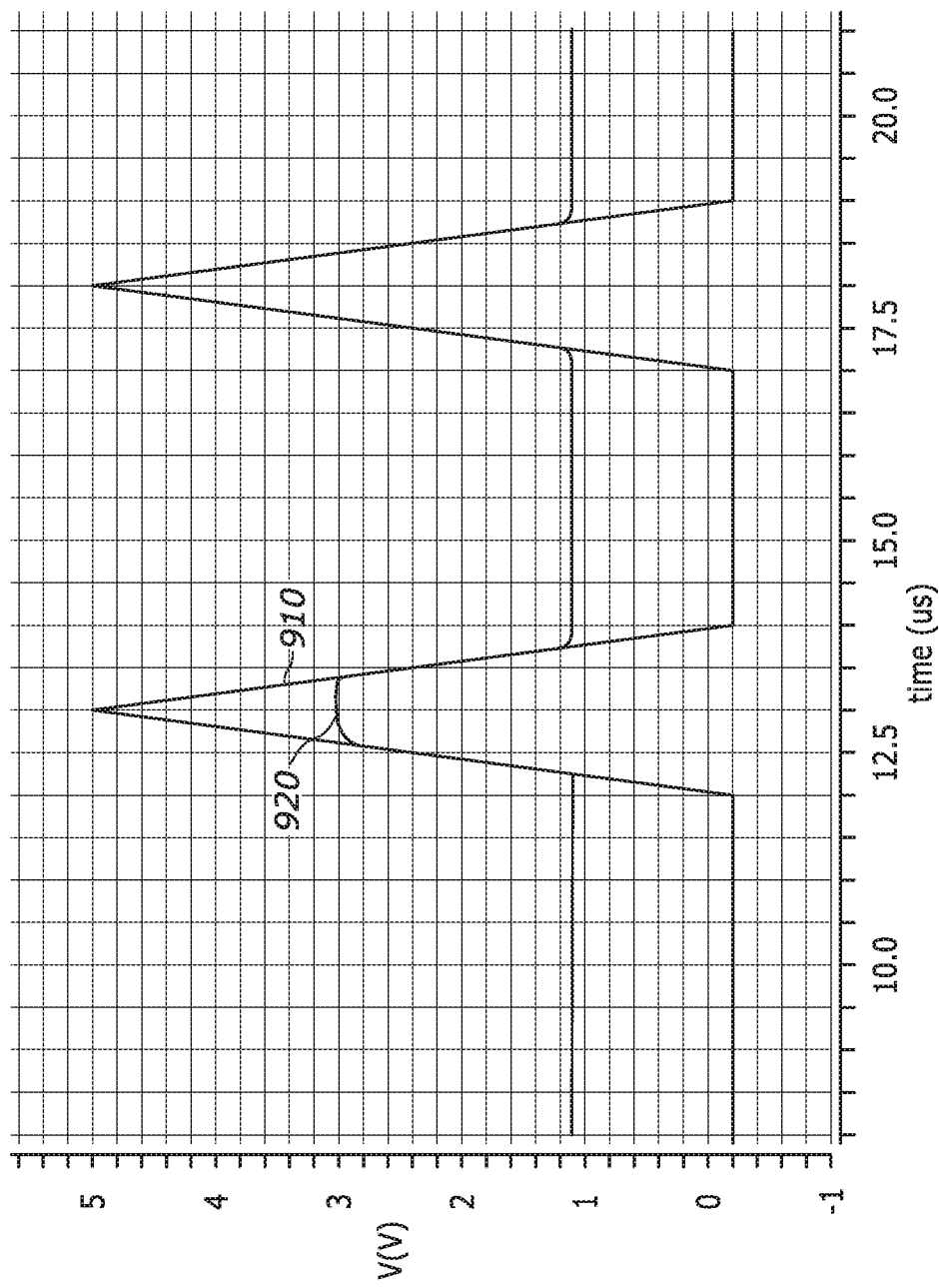

With respect to FIG. 9, the dynamic reference voltage is set at about 2.0V. An input voltage 910 swings from about −0.2V to about 5V and back to about −0.2V in a period of about 2.8 microseconds. As shown, a swing-limited output is generated at 920 which is limited to about 1.2V on the low end to about 3.0V on the high end.

Figure 10:
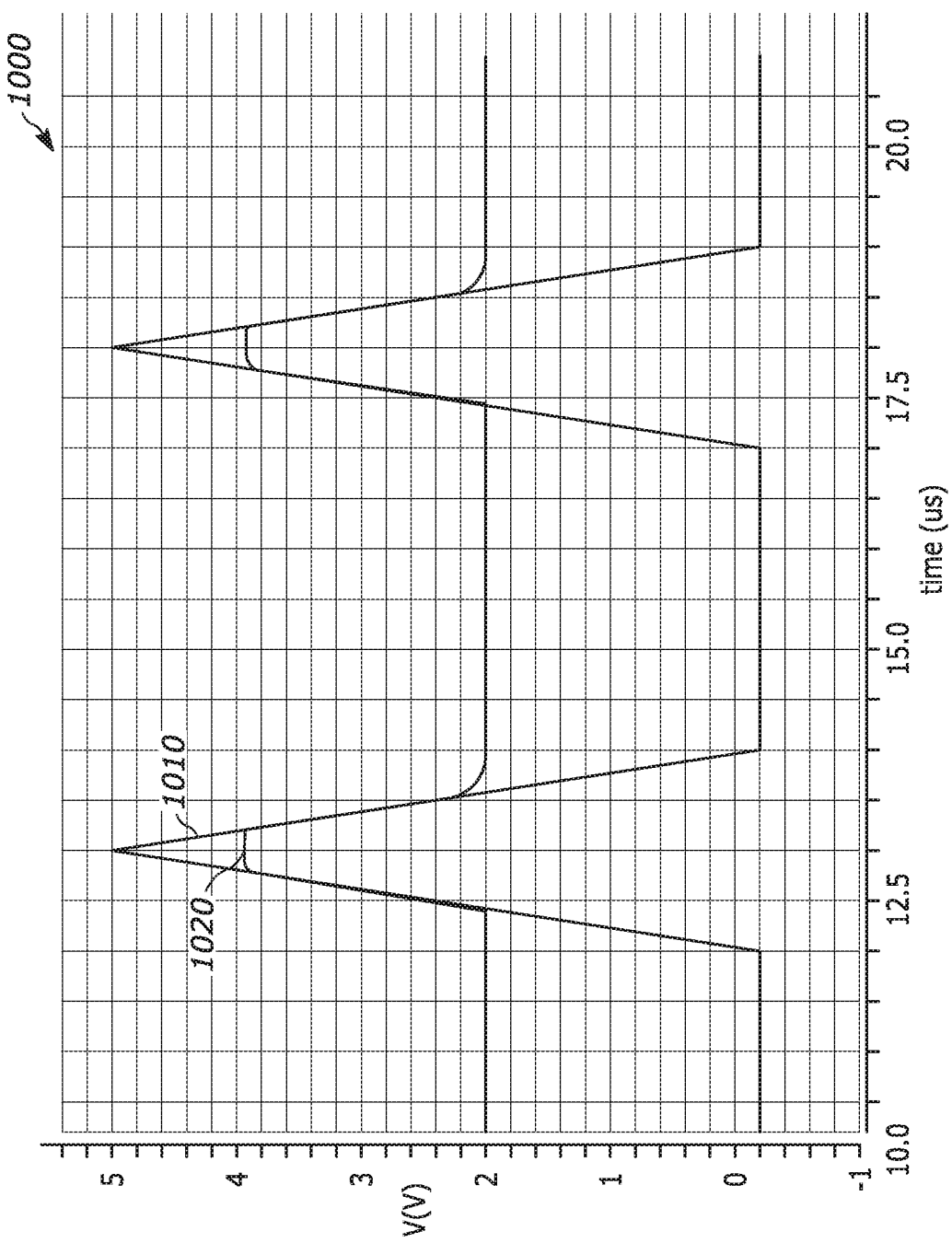

With respect to FIG. 10, the dynamic reference voltage is set at about 3.0V. An input voltage 1010 swings from about 0V to about 5V and back to about 0V in a period of about 2.8 microseconds. As shown, a swing-limited output is generated at 1120 which is limited to about 3.0V on the low end to about 3.9V on the high end.

Figure 11:
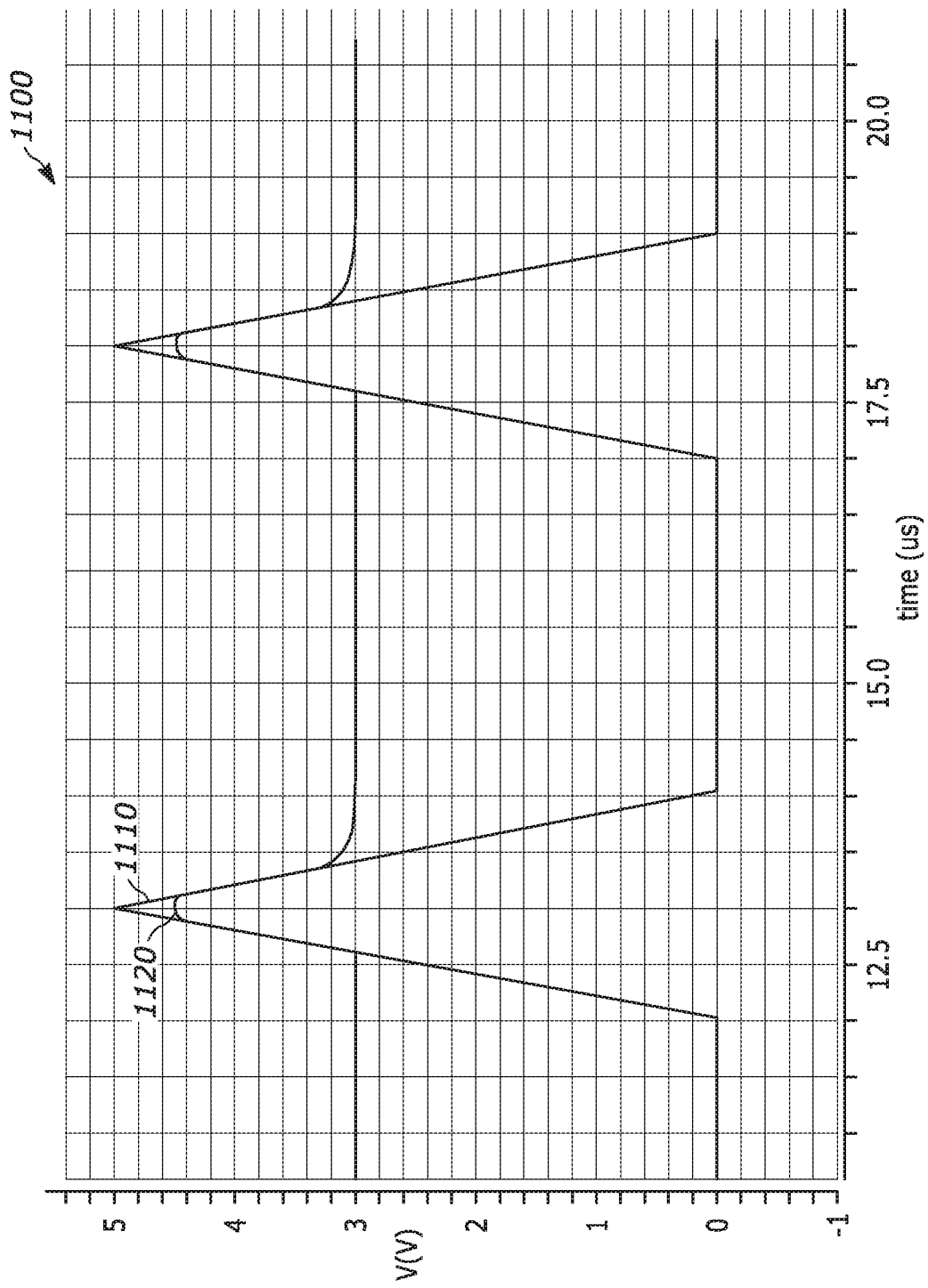

With respect to FIG. 11, the dynamic reference voltage is set at about 4.0V. An input voltage 1110 swings from about −0.2V to about 5V and back to about −0.2V in a period of about 2.8 microseconds. As shown, a swing-limited output is generated at 1020 which is limited to about 2.0V on the low end to about 4.5V on the high end.

What has been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A circuit, comprising:
 a tracking control module configured to receive an input voltage and a dynamic reference voltage, the tracking control module configured to generate a swing-limited output voltage to mitigate over-voltage swings of the input voltage, the tracking control module further comprising:
  a bias tracker configured to receive the dynamic reference voltage and to generate a reference tracking control signal that tracks voltage changes in the dynamic reference voltage; and
  a swing-limiter configured to receive the reference tracking control signal and the input voltage, the swing-limiter configured to limit the magnitude of the received input voltage based on a threshold and to adjust the swing-limited output voltage in response to the reference tracking control signal.

2. The circuit of claim 1, further comprising a radiation hardened by design (RHBD) device having a device input configured to receive the swing-limited output voltage from the tracking control module, the RHBD device operatively coupled to an integrated circuit (IC), the RHBD device configured to operate at a device voltage (VDEV) that is less than an operating voltage (VDD) of the IC.

3. The circuit of claim 2, wherein the IC includes a comparator circuit or an amplifier circuit configured to receive the dynamic reference voltage and the swing-limited output voltage, the comparator circuit or the amplifier circuit configured to generate an output signal based on the relationship of the swing-limited output voltage to the dynamic reference voltage, the output signal employed by the IC to regulate a control loop that includes a pulse width modulated (PWM) control loop.

4. The circuit of claim 2, wherein the bias tracker includes a bias input stage and a bias output stage, the bias input stage configured to receive an input bias current (IBIAS) and the operating voltage VDD of the IC, and the bias input stage configured to provide an output bias current based on IBIAS and VDD to bias the bias output stage of the bias tracker.

5. The circuit of claim 4, wherein the bias input stage includes a first transistor device, a second transistor device, a third transistor device, and a fourth transistor device, the first transistor device configured to receive IBIAS that is mirrored to drive the second transistor device, the second transistor device configured to provide current to drive the third transistor device in response to the first transistor device, ane the third transistor device configured to mirror the current received from the second transistor device to supply the output bias current to the bias output stage.

6. The circuit of claim 5, wherein the bias output stage includes a fifth transistor device and a sixth transistor device, the fifth transistor device configured to receive the dynamic reference voltage and to provide an output based on the dynamic reference voltage, and the sixth transistor device configured to receive the output from the fifth transistor device and the output bias current from the bias input stage to generate the reference tracking control signal from the bias tracker.

7. The circuit of claim 6, further comprising a seventh transistor device operative as the swing limiter, the seventh transistor device configured to receive the reference tracking control signal from the bias tracker and the input voltage, the seventh transistor device having an output node configured to generate the swing-limited output voltage based on the reference tracking control signal from the bias tracker and the input voltage.

8. The circuit of claim 7, further comprising a capacitor and a resistor, the capacitor configured to provide filtering of the reference tracking control signal from the bias tracker, and the resistor configured to supply the input voltage to the seventh transistor device.

9. The circuit of claim 8, further comprising an eighth transistor device configured to be controlled by a predetermined input voltage, the eighth transistor device coupled to the output node of the seventh transistor device to leak excess charge from the output node accumulated from radiation in outer space.

10. The circuit of claim 7, further comprising a ninth transistor device, a tenth transistor device configured to bypass the ninth transistor device, and a comparator configured to control the tenth transistor device, the ninth transistor device coupled in series with the seventh transistor device and configured to be controlled by a current output from the bias input stage, the comparator configured to compare a predetermined voltage to the dynamic reference voltage,
 wherein the comparator is configured to enable, based on the dynamic reference voltage being below the predetermined voltage, the tenth transistor device to bypass the ninth transistor device such that the seventh transistor device limits the swing-limited output voltage based on positive swings of the input voltage, and
 wherein the comparator is configured to diable, based on the dynamic reference voltage being above the predetermined voltage, the tenth transistor device and to enable the ninth transistor device to limit the swing-limited output voltage based on negative swings of the input voltage.

11. The circuit of claim 10, further comprising an eleventh transistor device and a twelfth transistor device that are configured to be controlled by a predetermined input voltage, the eleventh transistor device and the twelfth transistor device coupled to an output node of the ninth transistor device to leak excess charge from the output node accumulated from radiation in outer space.

12. A circuit, comprising:
 an integrated circuit (IC) that includes a radiation hardened by design (RHBD) device having a device input, the RHBD device operatively coupled to the IC and configured to operate at a device voltage (VDEV) that is less than an operating voltage (VDD) of the IC;
 a bias tracker configured to receive a dynamic reference voltage and to generate a reference tracking control signal that tracks voltage changes in the dynamic reference voltage, wherein the bias tracker includes a bias input stage and a bias output stage, the bias input stage configured to receive an input bias current (IBIAS) and the operating voltage VDD of the IC, and the bias input stage configured to provide an output bias current based on IBIAS and VDD to bias the bias output stage of the bias tracker; and a swing-limiter transistor device configured to receive the reference tracking control signal from the bias tracker and an input voltage, the swing-limiter transistor device configured to generate a swing-limited output voltage in response to the reference tracking control signal and the input voltage, the swing-limiter transistor device configured to limit the magnitude of the received input voltage based on a threshold and to adjust the swing-limited output voltage in response to the reference tracking control signal, the swing-limiter transistor device configured to provide the swing-limited output voltage to the RHBD device.

13. The circuit of claim 12, wherein the bias input stage includes a first transistor device, a second transistor device, a third transistor device, and a fourth transistor device, the first transistor device configured to receive IBIAS that is mirrored to drive the second transistor device, the second transistor device configured to provide current to drive the third transistor device in response to the first transistor device, and the third transistor device configured to mirror the current received from the second transistor device to supply the output bias current from the bias output stage.

14. The circuit of claim 13, wherein the bias output stage includes a fifth transistor device and a sixth transistor device, the fifth transistor device configured to receive the dynamic reference voltage and to provide an output based on the dynamic reference voltage, the sixth transistor device configured to receive the output from the fifth transistor device and the output bias current from the bias input stage to generate the reference tracking control signal from the bias tracker.

15. The circuit of claim 14, wherein the swing-limiter transistor device receives the reference tracking control signal from the bias tracker and the input voltage, the swing-limiter transistor device having an output node configured to generate the swing-limited output voltage based on the reference tracking control signal from the bias tracker and the input voltage.

16. The circuit of claim 15, further comprising a capacitor and a resistor, the capacitor configured to provide filtering of the reference tracking control signal from the bias tracker, and the resistor configured to supply the input voltage to the swing-limiter transistor device.

17. The circuit of claim 15, further comprising a ninth transistor device, a tenth transistor device configured to bypass the ninth transistor device, and a comparator configured to control the tenth transistor device, the ninth transistor device coupled in series with the swing-limiter transistor device and configured to be controlled by a current output from the bias input stage, the comparator configured to compare a predetermined voltage to the dynamic reference voltage,
wherein the comparator is configured to enable, based on the dynamic reference voltage being below the predetermined voltage, the tenth transistor device to bypass the ninth transistor device such that the swing-limiter transistor device limits the swing-limited output voltage based on positive swings of the input voltage, and wherein the comparator is configured to disable, based on the dynamic reference volateg being above the predetermined voltage, the tenth transistor device and to enable the ninth transistor device to limit the swing-limited output voltage based on negative swings of the input voltage.

18. The circuit of claim 17, further comprising an eleventh transistor device and a twelfth transistor device that are configured to be controlled by a predetermined input voltage, the eleventh transistor device and the twelfth transistor device coupled to an output node of the ninth transistor device to leak excess charge from the output node accumulated from radiation in outer space.

19. A system, comprising:
an integrated circuit (IC) that includes a radiation hardened by design (RHBD) device having a device input, the RHBD device operatively coupled to the IC and configured to operate at a device voltage (VDEV) that is less than an operating voltage (VDD) of the IC; and
a tracking control module that receives an input voltage and a dynamic reference voltage, the tracking control module configured to generate a swing-limited output voltage to the RHBD device based on the input voltage and the dynamic reference voltage, the tracking control module further comprising:
a bias tracker configured to receive the dynamic reference voltage and to generate a reference tracking control signal that tracks voltage changes in the dynamic reference voltage; and
a swing-limiter configured to receive the reference tracking control signal and the input voltage, the swing-limiter configured to limit the magnitude of the received input voltage to the RHBD device based on the threshold and to adjust the swing-limited output voltage in response to the reference tracking control signal.

20. The system of claim 19, wherein the bias tracker includes a bias input stage and a bias output stage, the bias input stage configured to receive an input bias current (IBIAS) and the operating voltage VDD of the IC, and the bias input stage configured to provide an output bias current based on IBIAS and VDD to bias the bias output stage of the bias tracker.

* * * * *